United States Patent
Saito et al.

(10) Patent No.: US 11,397,225 B2
(45) Date of Patent: Jul. 26, 2022

(54) CURRENT SENSOR, MAGNETIC SENSOR AND CIRCUIT

(71) Applicant: TDK Corporation, Tokyo (JP)

(72) Inventors: Yuta Saito, Tokyo (JP); Yoshihiro Kudo, Tokyo (JP); Daisuke Miyauchi, Tokyo (JP); Satoshi Abe, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 17/155,307

(22) Filed: Jan. 22, 2021

(65) Prior Publication Data

US 2021/0239774 A1    Aug. 5, 2021

(30) Foreign Application Priority Data

Jan. 31, 2020 (JP) .............................. JP2020-015443

(51) Int. Cl.
*G01R 33/09* (2006.01)
*G01R 1/20* (2006.01)
*G01R 15/20* (2006.01)

(52) U.S. Cl.
CPC ............ *G01R 33/09* (2013.01); *G01R 1/203* (2013.01); *G01R 15/205* (2013.01)

(58) Field of Classification Search
CPC ... G01R 1/203; G01R 15/205; G01R 33/0017
See application file for complete search history.

(56) References Cited

U.S. PATENT DOCUMENTS

| | | | |
|---|---|---|---|
| 6,411,078 B1 * | 6/2002 | Nakagawa | G01R 15/183 324/117 H |
| 2011/0204889 A1 * | 8/2011 | Nomura | G01R 1/203 324/252 |
| 2012/0062215 A1 | 3/2012 | Ide et al. | |
| 2013/0057275 A1 * | 3/2013 | Tamura | B60L 3/0038 324/252 |
| 2019/0339337 A1 * | 11/2019 | Sharma | G01R 33/098 |

FOREIGN PATENT DOCUMENTS

| | | |
|---|---|---|
| JP | 2012247191 A | 12/2012 |
| WO | 2006044031 A1 | 4/2006 |
| WO | 2013/129276 A1 | 9/2013 |
| WO | 2017/094336 A1 | 6/2017 |

* cited by examiner

*Primary Examiner* — Alvaro E Fortich
(74) *Attorney, Agent, or Firm* — Posz Law Group, PLC

(57) ABSTRACT

The current sensor comprises: a magnetic detecting device that is arranged in the vicinity of a conductor, to which a magnetic field to be measured induced by a current flowing through the conductor is applied, and that changes an electrical resistance in response to a change in the magnetic field to be measured; two coils that generate a canceling magnetic field to cancel the magnetic field to be measured and that are arranged in the vicinity of the magnetic detecting device; a shunt resistor, that is connected in series between the two coils, for detecting a current flowing through the coils; a first differential amplifier that amplifies the output signal of the magnetic detecting device and that supplies the current to induce the canceling magnetic field to the coils; and a second differential amplifier that amplifies the voltage across the shunt resistor and that outputs a measured voltage proportional to the current flowing through the conductor.

12 Claims, 10 Drawing Sheets

CURRENT SENSOR, MAGNETIC SENSOR AND CIRCUIT

RELATED APPLICATION INFORMATION

This application is based upon and claims the benefit of priority from Japanese Patent Application No. 2020-015443, filed on Jan. 31, 2020, the disclosure of which is incorporated herein in its entirety by reference.

BACKGROUND OF THE INVENTION

1. Field of the Invention

The present invention relates to a current sensor, a magnetic sensor and a circuit comprising a magnetic detecting device.

2. Description of the Related Art

In an inverter or a battery management system, an example is a current sensor for detecting a current flowing through a conductor in non-contact, a magnetic balance type current sensor that comprises a magnetic detecting device and a feedback coil arranged in the vicinity of the magnetic detecting device is known. The magnetic detecting device, for example, a well-known magneto-resistance effect element is used.

A magnetic balance type current sensor is a configuration in which the current supplied to the feedback coil is controlled to cancel a magnetic field to be measured induced by the current flowing through the conductor with the magnetic field (canceling magnetic field) generated by the feedback coil, so that the magnetic field applied to the magnetic detecting device is 0 (zero). In such a configuration, by converting the current flowing through the feedback coil into a voltage with a shunt resistor or the like, as a measurement value of the current flowing through the conductor, it is possible to obtain a measured voltage proportional to the current. The magnetic balance type current sensor provided with a magnetic detecting device is also described in, for example, WO 2017/094336 A1 (hereinafter referred to as "Patent Document 1") and WO 2013/129276 A1 (hereinafter referred to as "Patent Document 2").

Since the magnetic balance type current sensor as described above performs control with a closed loop system so that the magnetic field applied to the magnetic detecting device always becomes 0 (zero), the change of the output voltage to the change of the ambient temperature is small, and the linearity of the measured voltage to a current flowing through the conductor is also good, thus it is possible to measure the current with relatively high accuracy.

However, in recent years, with increased use of the current sensor, since relatively large current and small current may also be the object that is to be measured, a magnetic balance type current sensor that has higher noise tolerance is desired. Incidentally, not only the magnetic field induced by the current, such as a magnetic field or geomagnetism generated by the magnet, but also a magnetic balance type current sensor, can be used as a magnetic sensor for measuring the strength of various magnetic fields. For the circuit constituting the magnetic sensor and the sensor of such a magnetic balance system, because of increased use, it is desired that noise resistance be higher.

SUMMARY OF THE INVENTION

The present invention has been made to solve the problems of the background art as described above, and an object is to provide a current sensor, a magnetic sensor and a circuit with a high noise tolerance as compared with the background art thereof.

To achieve the above object, an exemplary aspect of the present invention provides a current sensor comprising:

a magnetic detecting device that is arranged in the vicinity of a conductor, to which a magnetic field to be measured induced by a current flowing through said conductor is applied, and that changes an electrical resistance in response to a change in the magnetic field to be measured;

two coils that generate a canceling magnetic field to cancel the magnetic field to be measured and that are arranged in the vicinity of the magnetic detecting device;

a shunt resistor, that is connected in series between the two coils, for detecting the current flowing through the coils;

a first differential amplifier that amplifies the output signal of the magnetic detecting device and that supplies the current to induce the canceling magnetic field to the coils; and a second differential amplifier that amplifies the voltage across the shunt resistor and that outputs a measured voltage proportional to the current flowing through the conductor.

An exemplary aspect of the present invention provides a magnetic sensor comprising:

a magnetic detecting device that changes the electrical resistance in response to a change in a magnetic field to be measured;

two coils that generate a canceling magnetic field to cancel the magnetic field to be measured and that are arranged in the vicinity of the magnetic detecting device;

a shunt resistor, that is connected in series between the two coils, for detecting the current flowing through the coils;

a first differential amplifier that amplifies the output signal of the magnetic detecting device and that supplies the current to induce the canceling magnetic field to the coils; and a second differential amplifier that amplifies the voltage across the shunt resistor and that outputs a measured voltage proportional to the current.

An exemplary aspect of the present invention provides a circuit comprising:

a magnetic detecting device that changes the electrical resistance in response to a change in a magnetic field to be measured;

two coils that generate a canceling magnetic field to cancel the magnetic field to be measured and that are arranged in the vicinity of the magnetic detecting device;

a shunt resistor, that is connected in series between the two coils, for detecting the current flowing through the coils;

a first differential amplifier that amplifies the output signal of the magnetic detecting device and that supplies the current to induce the canceling magnetic field to the coils; and a second differential amplifier that amplifies the voltage across the shunt resistor and that outputs a measured voltage proportional to the current.

The above and other objects, features, and advantages of the present invention will become apparent from the following description with reference to the accompanying drawings, which illustrate examples of the present invention.

DETAILED DESCRIPTION OF THE PREFERRED EMBODIMENTS

The present invention will be described with reference to the accompanying drawings.

First, a description will be given of a magnetic detecting device provided with a current sensor (magnetic sensor) of the present invention.

The magnetic detecting device comprises a magneto-resistance effect element for detecting an external magnetic field based on a change in electrical resistance caused by the magneto-resistance effect. As the examples of the magneto-resistance effect element, AMR (Anisotropic Magneto-Resistance effect) element, GMR (Giant Magneto-Resistance effect) element, and TMR (Tunnel Magneto-Resistance effect) element are known. Because the TMR element has excellent characteristics such as a large MR (Magneto-Resistive) ratio and a small temperature drift (a change in output with respect to a change in ambient temperature), it is preferable to use the TMR element. The magneto-resistance effect element (TMR element) comprises a fixed layer in which the magnetization direction is fixed, an insulating layer made of an insulator and a free layer in which the magnetization direction is changed in accordance with the direction of the external magnetic field, and the magneto-resistance effect element is a structure in which the fixed layer, the insulating layer and the free layer are laminated in this order. In the magneto-resistance effect element, the electrical resistance is changed according to the direction of magnetization of the free layer and the electrical resistance is the smallest when the magnetization direction of the free layer and the fixed layer are matched.

Figure 1:
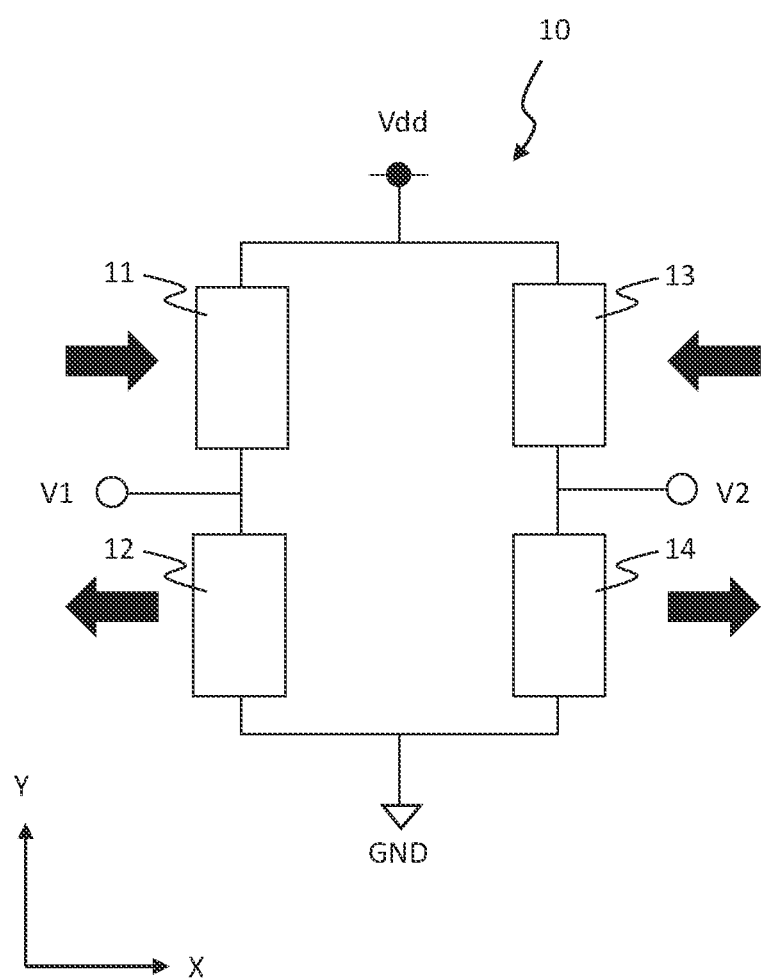
FIG. 1 is a circuit diagram showing a configuration example of a magnetic detecting device.

FIG. 1 is a circuit diagram showing an example of a configuration of a magnetic detecting device.

As shown in FIG. 1, magnetic detecting device 10 includes four magneto-resistance effect elements (first magneto-resistance effect element 11, second magneto-resistance effect element 12, third magneto-resistance effect element 13, fourth magneto-resistance effect element 14), and is a configuration to make a bridge circuit (Wheatstone bridge circuit) by connecting them to each other. Four magneto-resistance effect elements 11-14 are divided into two sets of 11, 12 and 13, 14, magneto-resistance effect elements 11, 12 are connected in series and magneto-resistance effect elements 13, 14 are connected in series. The ends of each of magneto-resistance effect element sets 11, 12, and 13, 14 are connected and are supplied constant power supply voltage (Vdd) from the voltage source (not shown), and the other ends of each of magneto-resistance effect element sets 11, 12, and 13, 14 are grounded (GND), respectively. Wheatstone bridge circuit allows the extraction of the mid-point voltages (V1, V2) respectively from the connection points of the two magneto-resistance effect elements of each set. The arrows shown in FIG. 1 represent examples of the magnetization directions of the fixed layer of each magneto-resistance effect element. X direction shown in FIG. 1 is a magneto-sensitive direction of the magneto-resistance effect element, and corresponds to the magnetization direction of the fixed layer. Y direction is a direction perpendicular to the magneto-sensitive direction (X direction) of the magneto-resistance effect element. In the following, the arrow indicating X direction in FIG. 1 is referred to as +X direction, the direction opposite to the arrow is referred to as −X direction. In magnetic detecting device 10 shown in FIG. 1, when an external magnetic field is applied in the +X direction, the electrical resistance of first and fourth magneto-resistance effect elements 11 and 14 is reduced, the electrical resistance of second and third magneto-resistance effect elements 12 and 13 is increased. Thus, mid-point voltage V1 is increased, and mid-point voltage V2 is lowered. On the other hand, when an external magnetic field is applied in the −X direction, the electrical resistance of first and fourth magneto-resistance effect elements 11 and 14 is increased, the electrical resistance of second and third magneto-resistance effect elements 12 and 13 is reduced. Thus, mid-point voltage V1 is lowered, and mid-point voltage V2 is increased. Therefore, by detecting V1-V2 which is the difference between mid-point voltages V1 and V2, twice the sensitivity, as compared with the case of detecting either mid-point voltage V1 or V2, is obtained. Furthermore, by detecting V1-V2 even when mid-point voltages V1 and V2 are offset, it is possible to eliminate the effect of the offsets.

Figure 2:
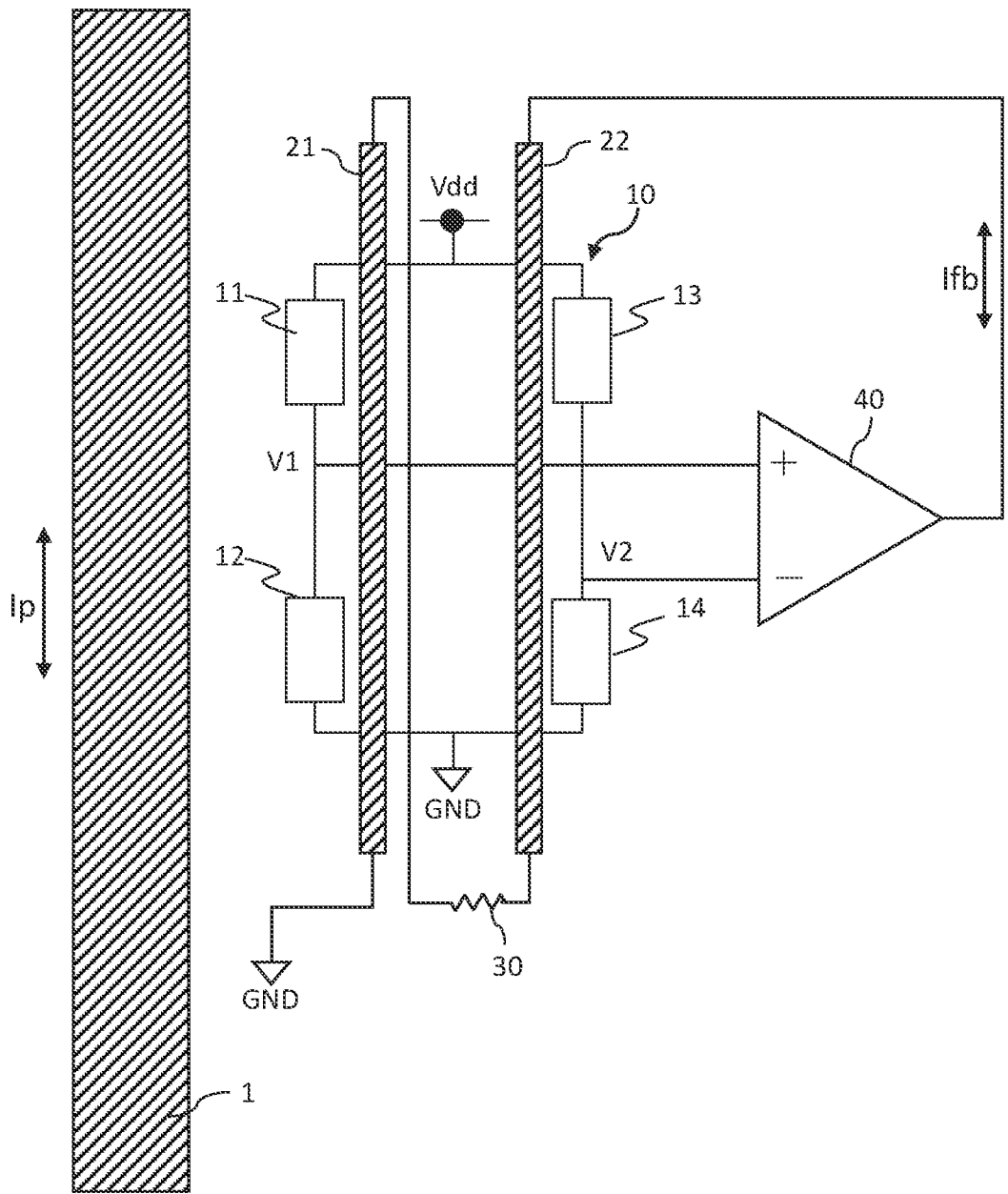
FIG. 2 is a schematic diagram showing a current detection principle of the current sensor of the present invention.

FIG. 2 is a schematic diagram showing the current detection principle of the current sensor of the present invention.

As shown in FIG. 2, the current sensor of the present invention comprises magnetic detecting device 10 shown in FIG. 1, two feedback coils 21, 22 arranged in the vicinity of magnetic detecting device 10, shunt resistor 30 for detecting current Ifb flowing through two feedback coils 21, 22, and first differential amplifier 40 to amplify the output signal of magnetic detecting device 10 and to supply current to feedback coils 21, 22 for inducing cancelation of magnetic field.

Magnetic detecting device 10 is arranged in the vicinity of conductor 1 through which current Ip flows, the magnetic field to be measured and that is induced by current Ip flowing is applied to magneto-resistance effect element 11 to 14 shown in FIG. 1.

Two feedback coils 21, 22 are connected in series with shunt resistor 30 therebetween, one feedback coil 21 is arranged in the vicinity of magneto-resistance effect elements 11, 12 connected in series, the other feedback coil 22 is arranged in the vicinity of magneto-resistance effect elements 13, 14 connected in series. Magneto-resistance effect elements 11, 12 are applied to the magnetic field induced by the current flowing through one of feedback coil 21 (canceling magnetic field), respectively, magneto-resistance effect elements 13, 14 are applied the magnetic field induced by the current flowing through the other feedback coil 22 (canceling magnetic field), respectively.

First differential amplifier 40 amplifies difference V-V2 of the mid-point voltages (V1, V2) of magnetic detecting device 10, and supplies current Ifb corresponding to the signal after amplification, to one end of feedback coil 21, shunt resistor 30 and feedback coil 22 connected in series. The other end of feedback coil 21, shunt resistor 30 and feedback coil 22 connected in series is grounded.

In such a configuration, the magnetic field to be measured induced by current Ip flowing through conductor 1 is canceled by the magnetic field (canceling magnetic field) generated from feedback coils 21, 22, current Ifb supplied to feedback coils 21, 22 is controlled by first differential amplifier 40 so that the magnetic field applied to magnetic detecting device 10 is 0 (zero). At this time, by detecting the voltage across shunt resistor 30, it is possible to obtain a measured voltage proportional to current Ifb flowing through feedback coils 21, 22. Since current Ifb flowing through feedback coils 21, 22 is proportional to current Ip flowing through conductor 1, the measured voltage is also proportional to current Ip flowing through conductor 1.

FIG. 2 shows a configuration example in which the magnetic field to be measured that is induced by current Ip is directly applied to magnetic detecting device 10, when the value of current Ip is large, i.e., when the magnetic field to be measured has a great intensity, the magnetic field to be measured by applying the magnetic field to magnetic detecting device 10 may be attenuated by forming a well-known magnetic shield. Further, FIG. 2 shows a configuration example of supplying current Ifb directly to two feedback coils 21, 22 from the output of first differential amplifier 40, the output side of first differential amplifier 40 may be provided with a coil driver circuit for supplying the required current to feedback coils 21, 22.

Figure 3A:
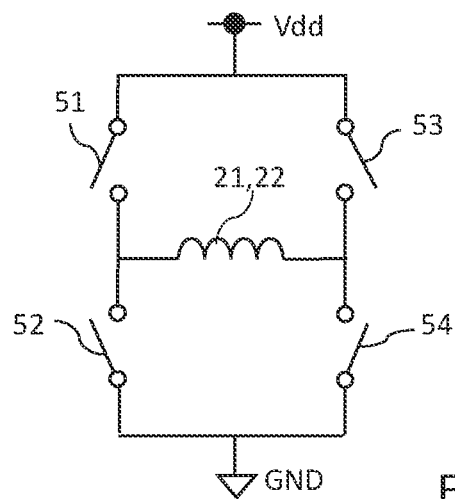
FIG. 3A is a circuit diagram showing an example of a coil driver circuit.
Figure 3B:
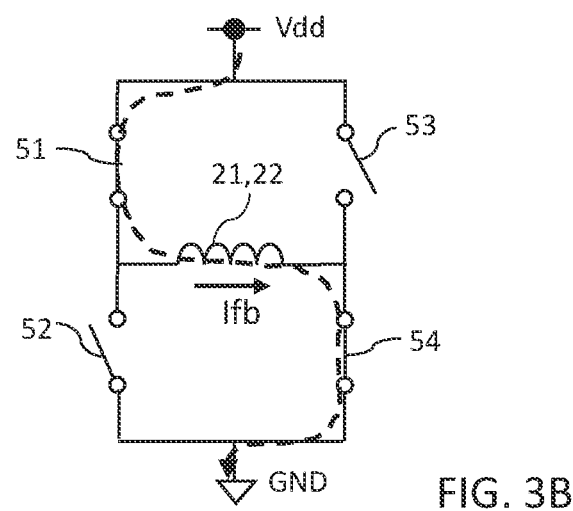
FIG. 3B is a schematic diagram showing an operation example of the coil driver circuit shown in FIG. 3A.
Figure 3C:
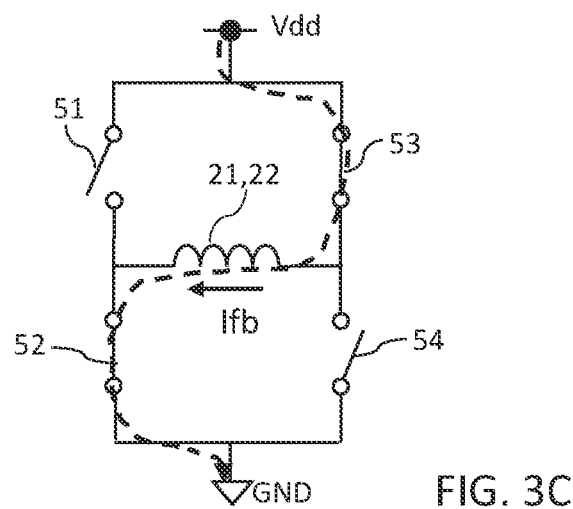
FIG. 3C is a schematic diagram showing an operation example of the coil driver circuit shown in FIG. 3A.

FIG. 3A is a circuit diagram showing an exemplary coil driver circuit. FIGS. 3B and 3C are schematic diagrams showing an operation example of the coil driver circuit shown in FIG. 3A. In FIGS. 3A-3C, for simplicity, two feedback coils 21, 22 connected in series are described as one coil.

As shown in FIG. 3A, coil driver circuit 50 includes four switches 51 to 54, in a configuration that is obtained by forming a bridge circuit (H-bridge circuit) by connecting them to each other. Four switches 51-54 are divided into two sets 51, 52 and 53, 54, switches 51, 52 are connected in series and switches 53, 54 are connected in series. The ends of each of switch sets 51, 52, and 53, 54 are connected and supplied constant power supply voltage (Vdd) from the voltage source (not shown), and the other ends of each of switch sets 51, 52, and 53, 54 are grounded (GND), respectively.

The feedback coils 21, 22 are connected between the connection points of the two switches of each set, and the direction of current Ifb flowing is switched by the combination of switches to be turned on, as shown in FIGS. 3B and 3C. The on/off of four switches 51-54 is controlled based on the output voltage of differential amplifier 40.

Switches 51-54 may use a well known bipolar transistor or FET (Field Effect Transistor).

Figure 4:
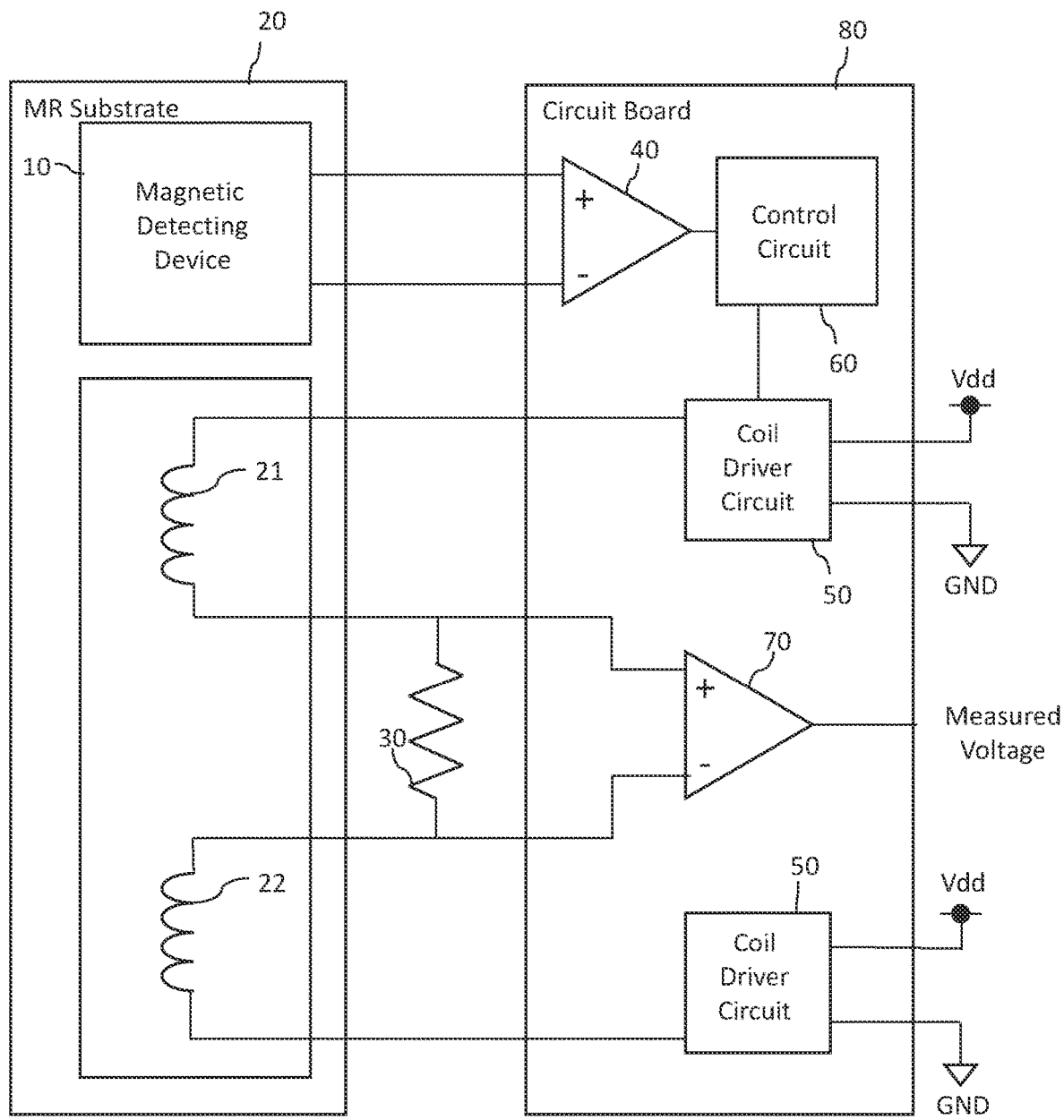
FIG. 4 is a block diagram showing an example of a configuration of the current sensor of the present invention.
Figure 5:
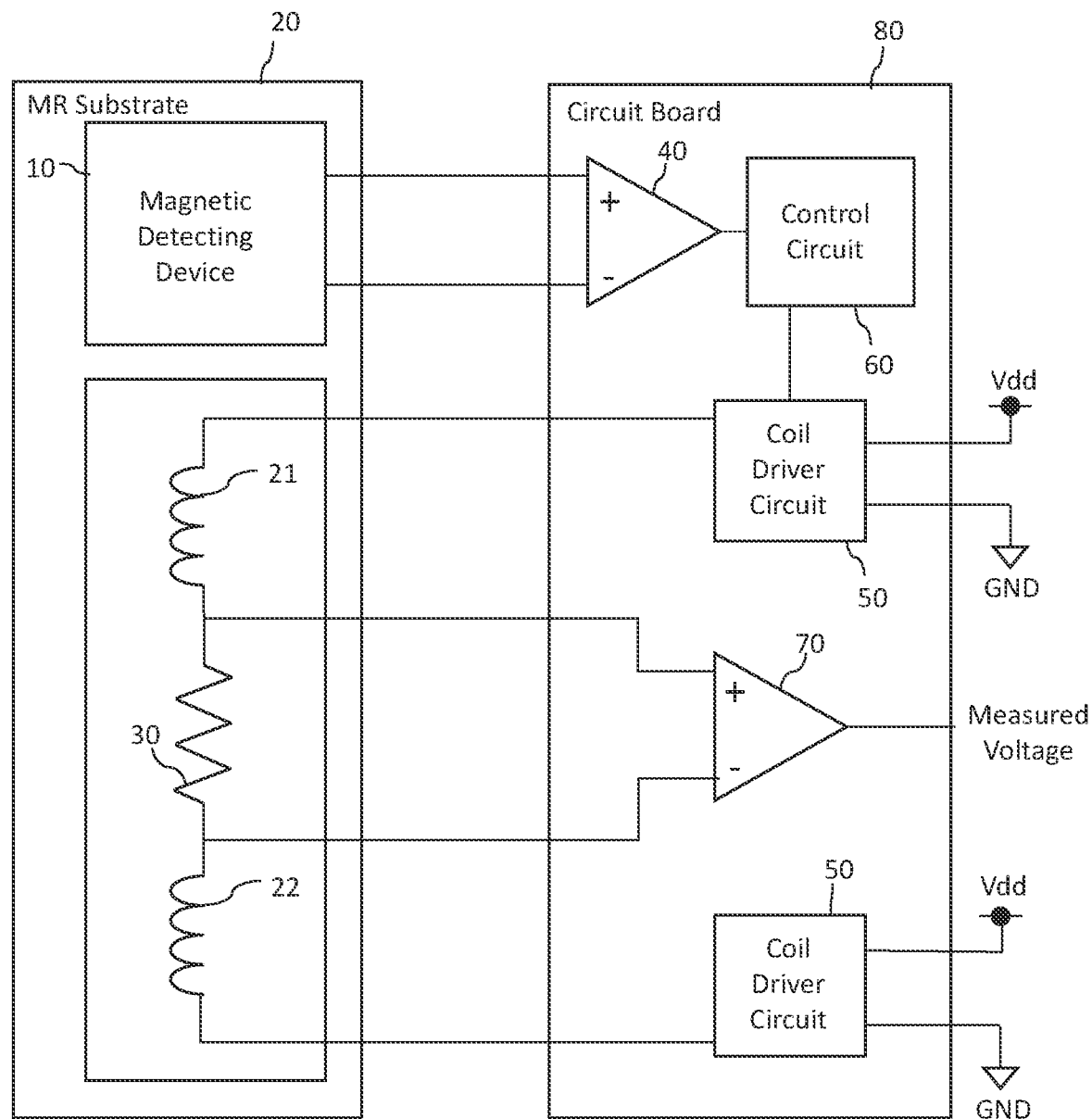
FIG. 5 is a block diagram showing an example of a configuration of the current sensor of the present invention.

FIGS. 4 and 5 are block diagrams showing a configuration example of the current sensor of the present invention.

FIG. 4 shows a configuration in which two feedback coils 21, 22 are formed on MR substrate 20 that comprises magnetic detecting device 10, and in which first differential amplifier 40, coil driver circuit 50, control circuit 60 for controlling the operation of coil driver circuit 50 and second differential amplifier 70 for outputting a measured voltage proportional to current Ifb flowing through shunt resistor 30 are formed on circuit board 80, respectively. In the current sensor shown in FIG. 4, shunt resistor 30 is externally arranged without being mounted on MR substrate 20 and on circuit board 80.

Control circuit 60, for example, can be realized by an ASIC (Application Specific Integrated Circuit) comprising an A/D converter for converting the output voltage of first differential amplifier 40 to the digital signal and a DSP (Digital Signal Processing) for performing various signal processing. In that case, the ASIC may be provided with the functions of first differential amplifier 40, coil driver circuit 50 and second differential amplifier 70.

FIG. 5 shows a configuration in which two feedback coils 21, 22 and shunt resistor 30 are formed on MR substrate 20 that includes magnetic detecting device 10, and in which first differential amplifier 40, coil driver circuit 50, control circuit 60 and second differential amplifier 70 are formed on circuit board 80, respectively.

FIG. 4 shows a configuration example in which MR substrate 20, shunt resistor 30 and circuit board 80 are individually comprised, FIG. 5 shows a configuration example in which MR substrate 20 and circuit board 80 are individually comprised. MR substrate 20 and circuit board 80 that are shown in FIGS. 4 and 5 may be housed in one package.

Furthermore, in FIGS. 4 and 5, coil driver circuit 50 is described in two parts based on the positional relation between feedback coils 21, 22 and shunt resistor 30, and coil driver circuit 50 is one circuit as shown in FIGS. 3A to 3C.

Figure 6A:
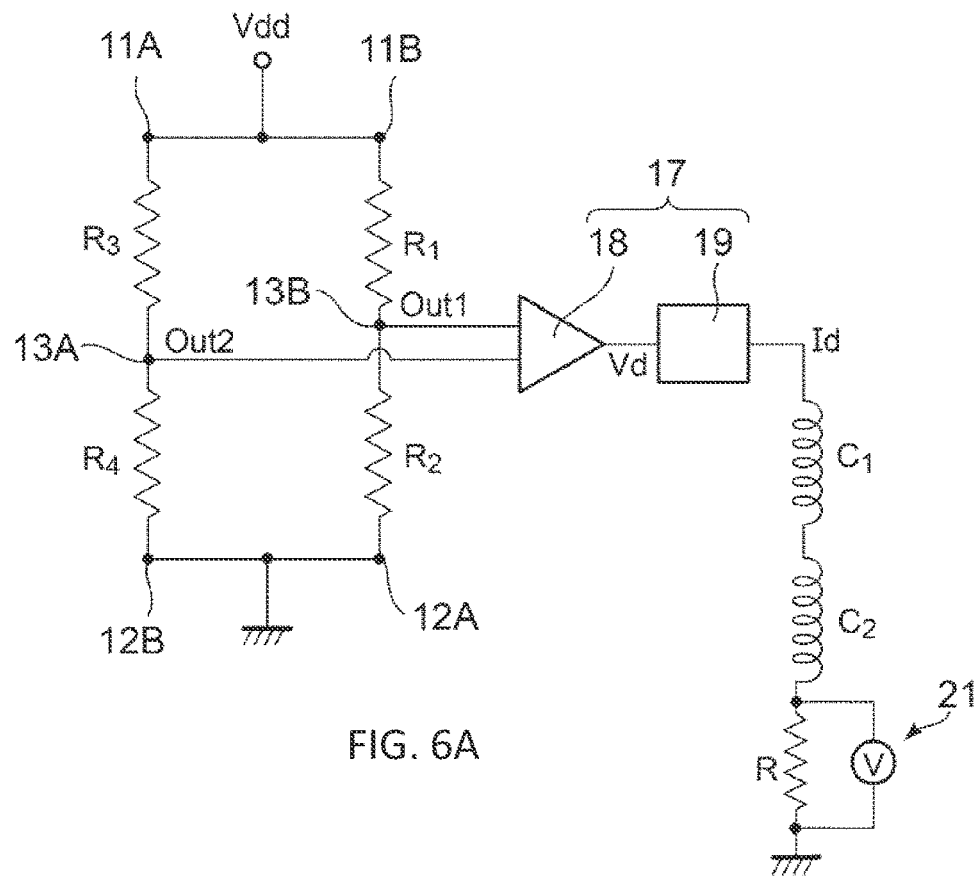
FIG. 6A-6B are circuit diagram showing a configuration of a comparative example of a current sensor.
Figure 6B:
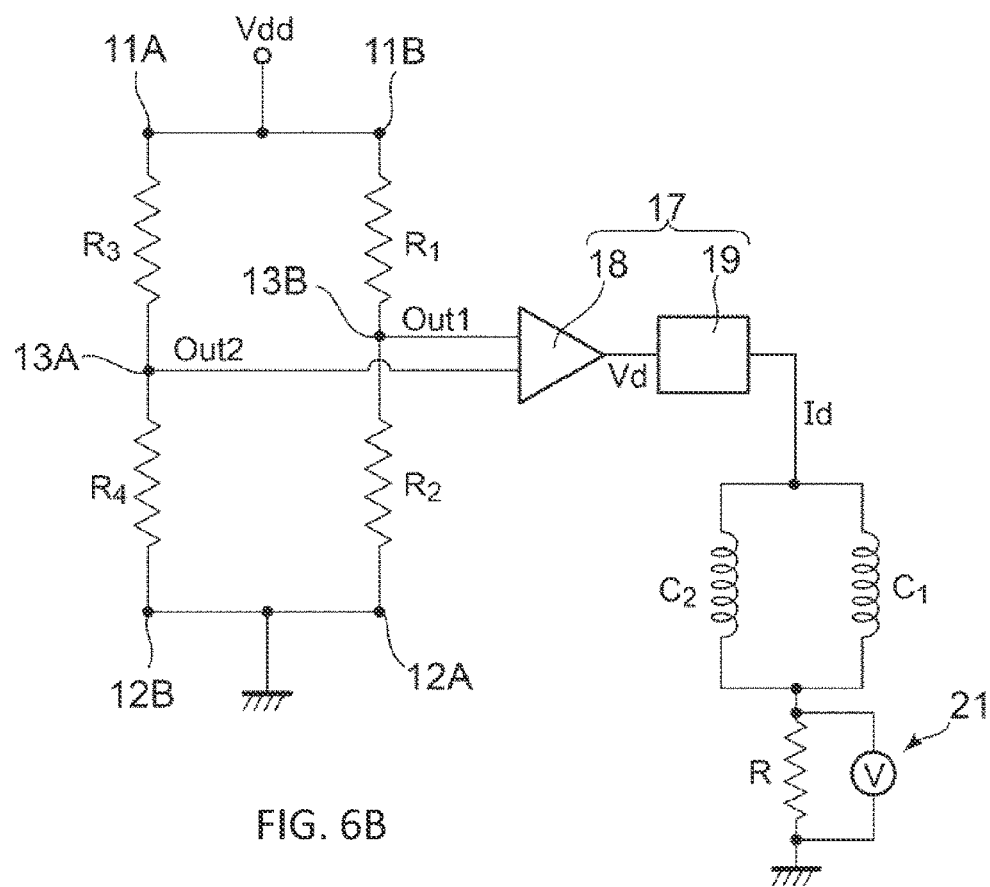

FIGS. 6A and 6B are circuit diagrams showing the configuration of comparative examples of the current sensor. FIGS. 6A and 6B show the current sensor described in Patent Document 1. FIG. 6A shows an example of a circuit in which two feedback coils ($C_1$, $C_2$) are connected in series, and FIG. 6B shows an example of a circuit in which two feedback coils ($C_1$, $C_2$) are connected in parallel. Although, FIGS. 6A and 6B show the current sensor described in Patent Document 1, the current sensor described in Patent Document 2 has a similar configuration. In FIGS. 6A and 6B, R1 to R4 are magneto-resistance effect elements included in the magnetic detecting device 10. Furthermore, in FIGS. 6A and 6B, 18 corresponds to first differential amplifier 40 of the present invention, 19 corresponds to coil driver circuit 50 and control circuit 60 of the present invention, and 21 corresponds to second differential amplifier 70 of the present invention.

As shown in FIGS. 6A and 6B, the current sensor of the background art is a configuration in which shunt resistor (R) is connected between two feedback coils ($C_1$, $C_2$) connected in series and a ground potential or is connected between two feedback coils in parallel and a ground potential. In such configurations, since the resistance values of the signal lines connected to the two input terminals of second differential amplifier 21 for outputting a measured voltage are asymmetrical, in second differential amplifier 21, the ability to remove the noise component of the common phase input to the two input terminals (common mode noise) is lowered. That is, CMMR (Common Mode Rejection Ratio) in second differential amplifier 21 that outputs a measured voltage by amplifying the voltage across shunt resistor (R) is lowered.

On the other hand, the present invention is a configuration in which two feedback coils 21, 22 are connected in series with shunt resistor 30 therebetween, and both ends of shunt resistor 30 are connected to the two inputs of second differential amplifier 70 as shown in FIGS. 4 and 5. Therefore, in the present invention, the resistance values of the signal lines connected to the two input terminals of second differential amplifier 70 are symmetrical. Therefore. CMMR in second differential amplifier 70 is improved as compared with the current sensor of the background art shown in FIGS. 6A and 6B, and the current sensor that has high noise-resistant properties can be obtained.

At this time, when magnetic detecting device 10, feedback coils 21, 22 and shunt resistor 30 are respectively formed on MR substrate 20 as shown in FIG. 5, the current sensor can be miniaturized as compared with the configuration in which shunt resistor 30 is externally arranged as shown in FIG. 4, and the cost of the current sensor can be also reduced to reduce the number of components.

Furthermore, in the configuration in which shunt resistor 30 is externally arranged as shown in FIG. 4, the contact resistance is increased at the connection portion between feedback coils 21, 22 and shunt resistor 30. On the other hand, in the configuration in which feedback coils 21, 22 and shunt resistor 30 are formed on MR substrate 20 shown in FIG. 5, any increase in the contact resistance can also be reduced. Therefore, in the current sensor shown in FIG. 5, current Ifb flowing through feedback coils 21, 22, i.e. current Ip flowing through conductor 1 can be detected more accurately than the current sensor shown in FIG. 4.

Figure 7:
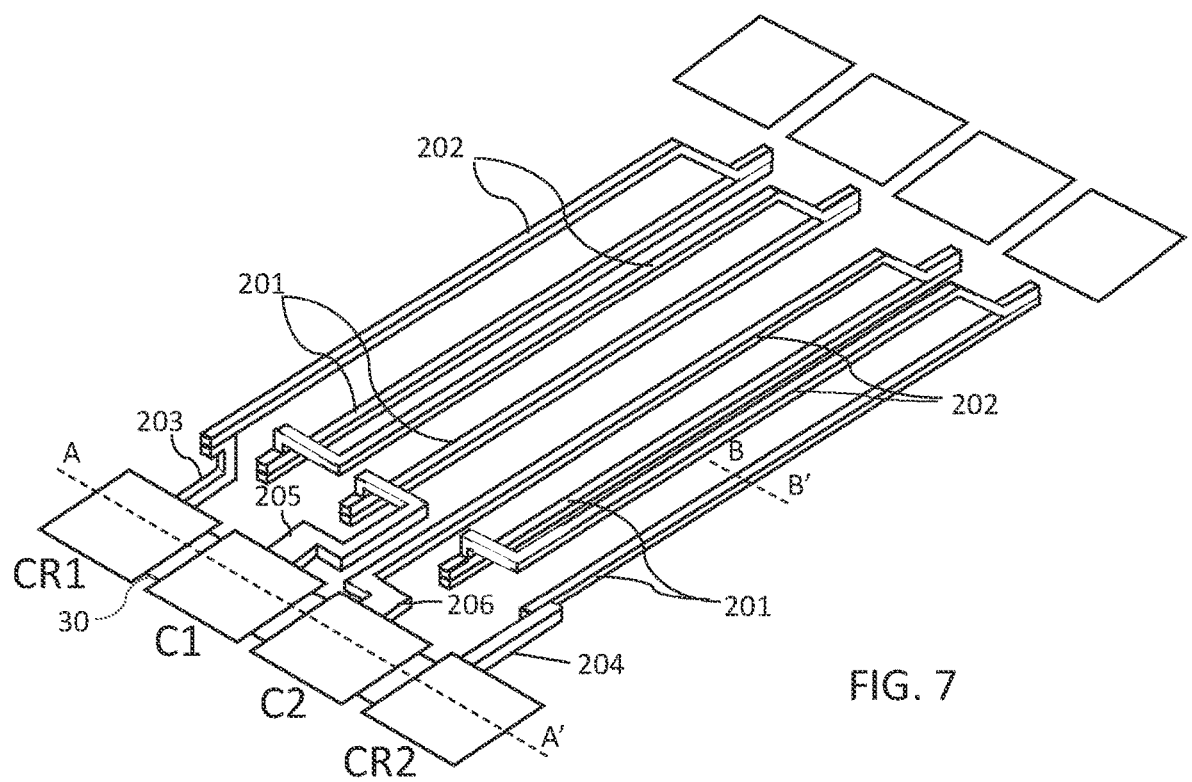
FIG. 7 is a schematic diagram showing an example of a configuration of a shunt resistor and the feedback coil shown in FIG. 2.
Figure 8:
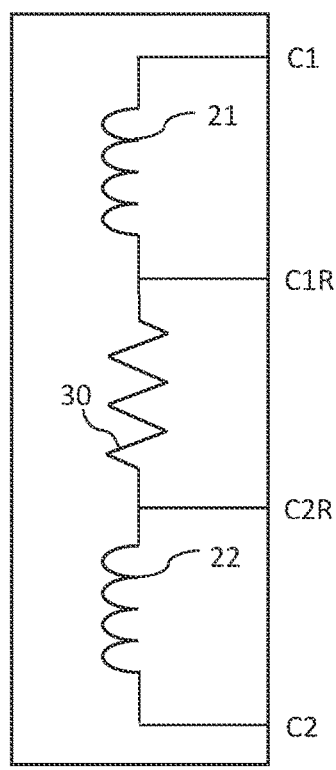
FIG. 8 is a circuit diagram showing a connection example of the shunt resistor and the feedback coil shown in FIG. 7.
Figure 9:
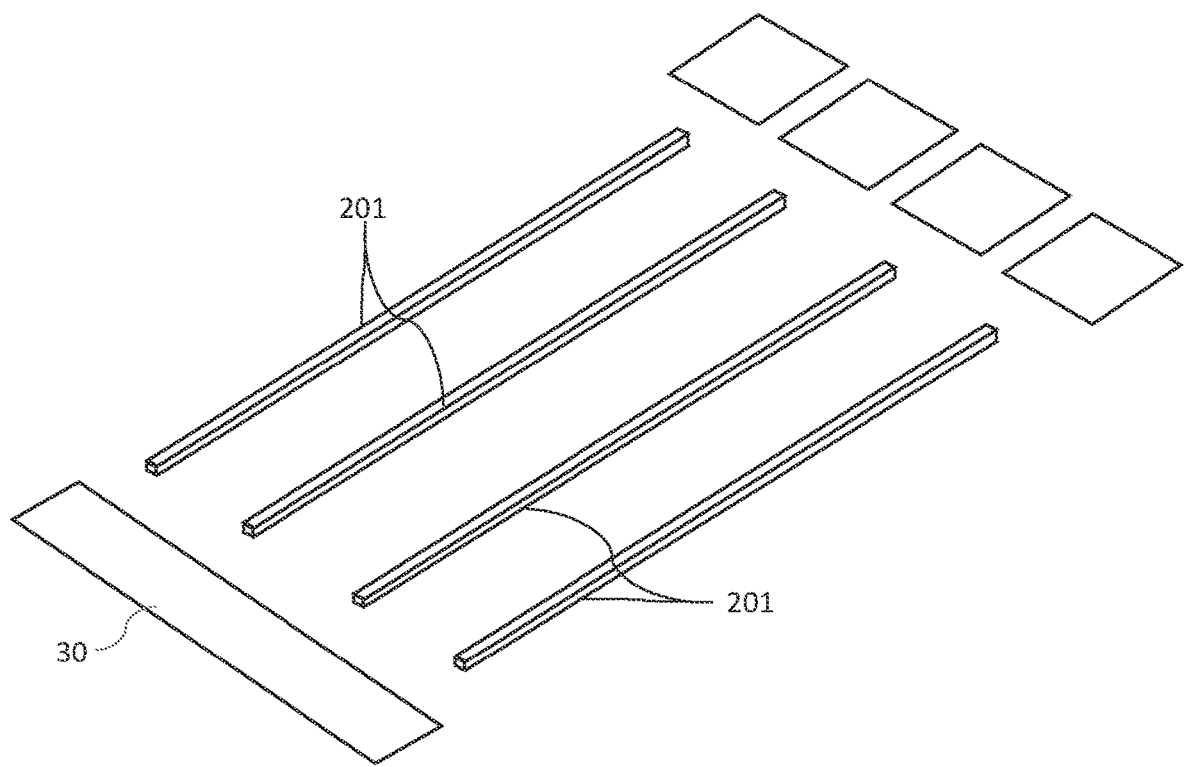
FIG. 9 is a schematic diagram showing an arrangement example of the shunt resistor and the lower coil shown in FIG. 7.
Figure 10:
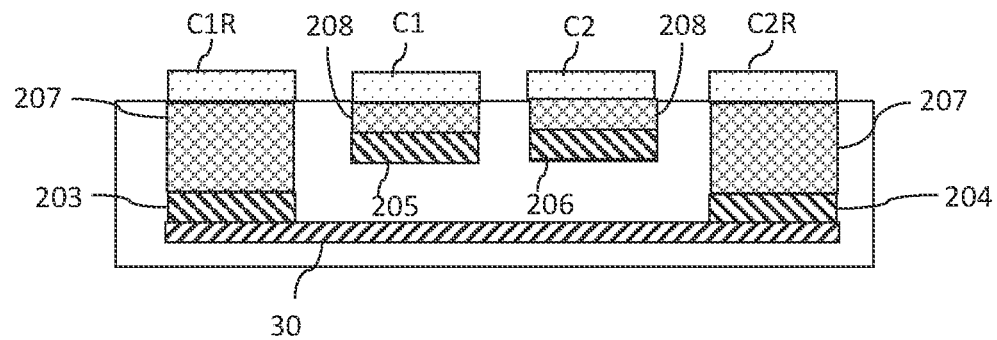
FIG. 10 is a cross-sectional view showing an example of the structure of the shunt resistor and the feedback coil shown in FIG. 7.
Figure 11:
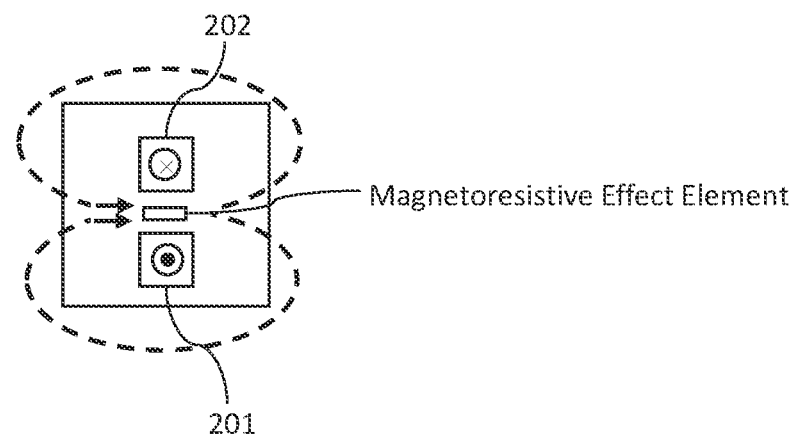
FIG. 11 is a cross-sectional view showing an example of the structure of the shunt resistor and the feedback coil shown in FIG. 7.
Figure 12:
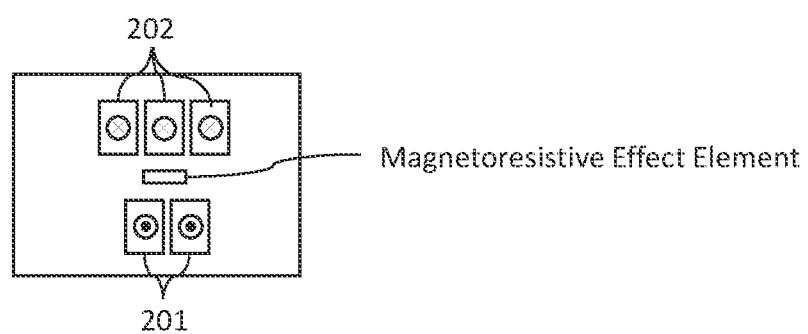
FIG. 12 is a cross-sectional view showing another example of the structure of the shunt resistor and the feedback coil shown in FIG. 7.

FIG. 7 is a schematic diagram showing an example of a configuration of a shunt resistor and feedback coils shown in FIG. 2. FIG. 8 is a circuit diagram showing a connection example of the shunt resistor and the feedback coils shown in FIG. 7. FIG. 9 is a schematic diagram showing an arrangement example of the shunt resistor and the lower coils shown in FIG. 7. FIGS. 10 and 11 are cross-sectional views showing an example of the structure of the shunt resistor and the feedback coils shown in FIG. 7. FIG. 12 is a cross-sectional view showing another example of the structure of the shunt resistor and the feedback coils shown in FIG. 7. FIG. 10 shows a state of cutting shunt resistor 30 and feedback coils 21, 22 shown in FIG. 7 along A-A'. FIGS. 11 and 12 show a state of cutting shunt resistor 30 and feedback coils 21, 22 shown in FIG. 7 along B-B'. FIGS. 7 to 12 schematically show an example of the arrangement relationship of feedback coils 21, 22 and shunt resistor 30, but FIGS. 7 to 12 do not accurately show the shape and dimensions.

Usually, when a coil is formed on a substrate, the following two types are possible: a pancake-shaped coil (see Patent Document 1) in which signal lines are arranged in a ring shape (or spiral shape) in parallel with the plane of the substrate; and a toroidal-shaped coil (see Patent Document 2) in which signal lines are arranged in a ring shape (or spiral shape) in parallel with the thickness direction of the substrate. In the pancake-shaped coil, since the exclusive area in the substrate plane is increased, it causes the current sensor to become large. Furthermore, in the pancake-type coils, since the resistance value (direct resistance value) is larger than the toroidal-shaped coil, the maximum value of the current that can be supplied from the power supply is lower than the toroidal-shaped coil. Hence, the strength (maximum value) of the magnetic field that can be generated in the pancake-shaped coil is lower than the toroidal-shaped coil. Thus, in the configuration in which feedback coils 21, 22 are formed with the pancake-shaped, the detection magnetic field range (dynamic range) in the current sensor shown in FIG. 2 is narrowed. Therefore, in the present invention, feedback coils 21, 22 included in the current sensor are formed in the toroidal-shaped.

As shown in FIG. 7, the feedback coils 21, 22 are a configuration in which lower coils 201 are arranged (see FIG. 9) on MR substrate 20 (not shown) that is formed on shunt resistor 30, upper coils 202 are arranged on lower coils 201. Lower coil 201 and upper coil 202 are connected to each other at their ends. Four of each lower coil 201 and upper coil 202 are arranged corresponding to four magneto-resistance effect elements 11 to 14 that are included in magnetic detecting device 10 shown in FIG. 1 (not shown in FIG. 7). A pair of lower coil 201 and upper coil 202 is arranged corresponding to magneto-resistance effect elements 11 to 14, respectively. Magneto-resistance effect elements 11-14 are arranged between a pair of correspondingly arranged lower coil 201 and upper coil 202, respectively (see FIG. 11).

As shown in FIGS. 4, 5, 7, 8 and 10, shunt resistor 30 is connected to electrode pads C1R and C2R at both ends of the four electrode pads arranged in parallel with shunt resistor 30, and electrode pads C1 and C2 are connected to coil driver circuit 50. As shown in FIG. 7, electrode pad C1R is connected to upper coil 202 via first extension wiring 203, and electrode pad C2R is connected to lower coil 201 via second extension wiring 204. Electrode pad C1 is connected to lower coil 201 via third extension wiring 205, electrode pad C2 is connected to upper coil 202 via fourth extension wiring 206.

As shown in FIG. 10, first extension wiring 203 is formed at one end of shunt resistor 30, and first extension wiring 203 is connected to electrode pad C1R through first conductive layer 207. Second extension wiring 204 is formed at the other end of shunt resistor 30, and second extension wiring 204 is connected to electrode pad C2R through first conductive layer 207. Third extension wire 205 is connected to electrode pad C1 through second conductive layer 208, and fourth extension wire 206 is connected to electrode pad C2 through second conductive layer 208.

As shown in FIG. 11, the magneto-resistance effect element that is included in magnetic detecting device 10 is arranged between lower coil 201 and upper coil 202, the magneto-resistance effect element is applied with the magnetic field to be measured generated in conductor 1, and is applied with canceling magnetic field induced by current flowing through lower coil 201 and upper coil 202, respectively.

FIGS. 7 and 9 to 11 show an example in which lower coil 201 and upper coil 202 are respectively formed by one signal line, and in which the number of turns of feedback coils 21, 22 is 1. The number of turns of feedback coils 21, 22 formed by lower coil 201 and upper coil 202 may be plural number, and lower coil 201 and upper coil 202 may be formed by a plurality of signal lines connected in parallel.

FIG. 12 shows a configuration example in which lower coil 201 is formed by two signal lines connected in parallel, and upper coil 202 is formed by three signal lines connected in parallel. In a configuration in which lower coils 201 and upper coils 202 are formed by a plurality of signal lines connected in parallel, since it is possible to reduce the resistance value of feedback coils 21, 22 (direct resistance value), the detection magnetic field range (dynamic range) in the current sensor shown in FIG. 2 can be broadened.

In the above description, an example was shown in which the circuit of the present invention comprising magnetic detecting device 10, feedback coils 21, 22, shunt resistor 30, first differential amplifier 40 and second differential amplifier 70 are used as a current sensor for detecting the current Ip flowing through conductor 1. The circuit of the present invention comprising magnetic detecting device 10, feedback coil 21, 22, shunt resistor 30, first differential amplifier 40 and second differential amplifier 70, as described above, can also be used as a magnetic sensor for measuring the strength of various magnetic fields.

As described above, the present invention is configured in which two feedback coils 21, 22 are connected in series with shunt resistor 30 therebetween, and in which both ends of shunt resistor 30 are connected to the two inputs of second differential amplifier 70; the resistance value of the signal line that is connected to the two input terminals of second differential amplifier 70 becomes symmetrical. Therefore, according to the present invention, CMMR in second differential amplifier 70 is improved as compared with the background art, and it is possible to obtain a current sensor, a magnetic sensor and circuit having high noise-resistant properties.

In particular, the current sensor of the present invention, when used in conjunction with a well-known magnetic shield, is also suitable for applications to measure a large current at high speed. Furthermore, in the present invention, feedback coils 21, 22, shunt resistor 30, magnetic detecting device 10 and the circuit used for closed-loop control (first differential amplifier 40, coil driver circuit 50, control circuit 60 and second differential amplifier 70, etc.) can be accommodated in one package, and this contributes to saving space in equipment comprising a sensor or circuit of the present invention.

While the invention has been particularly shown and described with reference to exemplary embodiments thereof, the invention is not limited to these embodiments. It will be understood by those ordinarily skilled in the art that various changes in form and details may be made therein without departing from the spirit and scope of the present invention as defined by the claims.

What is claimed is (for US):

1. A current sensor comprising:
    a magnetic detecting device that is arranged in the vicinity of a conductor, to which a magnetic field to be measured induced by a current flowing through said conductor is applied, and that changes an electrical resistance in response to a change in said magnetic field to be measured;
    two coils that generate a canceling magnetic field to cancel said magnetic field to be measured and that are arranged in the vicinity of said magnetic detecting device;
    a shunt resistor, that is connected in series between said two coils, for detecting a current flowing through said coils;
    a first differential amplifier that amplifies the output signal of said magnetic detecting device and that supplies the current to induce said canceling magnetic field to said coils; and
    a second differential amplifier that amplifies the voltage across said shunt resistor and that outputs a measured voltage proportional to the current flowing through said conductor.

2. The current sensor according to claim 1, wherein said magnetic detecting device, said two coils and said shunt resistor are formed on a same substrate.

3. The current sensor according to claim 1, wherein said two coils are respectively formed in a toroidal shape.

4. The current sensor according to claim 1, wherein said magnetic detecting device comprises a magneto-resistance effect element, and said magneto-resistance effect element is a tunnel magneto-resistance effect element.

5. A magnetic sensor comprising:
    a magnetic detecting device that changes the electrical resistance in response to a change in a magnetic field to be measured;
    two coils that generate a canceling magnetic field to cancel said magnetic field to be measured and that are arranged in the vicinity of said magnetic detecting device;
    a shunt resistor, that is connected in series between said two coils, for detecting a current flowing through said coils;
    a first differential amplifier that amplifies the output signal of said magnetic detecting device and that supplies the current to induce said canceling magnetic field to said coils; and
    a second differential amplifier that amplifies the voltage across said shunt resistor and that outputs a measured voltage proportional to the current flowing through said conductor.

6. The current sensor according to claim 5, wherein said magnetic detecting device, said two coils and said shunt resistor are formed on a same substrate.

7. The magnetic sensor according to claim 5, wherein said two coils are respectively formed in a toroidal shape.

8. The magnetic sensor according to claim 5, wherein said magnetic detecting device comprises a magneto-resistance effect element, and said magneto-resistance effect element is a tunnel magneto-resistance effect element.

9. A circuit comprising:
    a magnetic detecting device that changes the electrical resistance in response to a change in a magnetic field to be measured;
    two coils that generate a canceling magnetic field to cancel said magnetic field to be measured and that are arranged in the vicinity of said magnetic detecting device;
    a shunt resistor, that is connected in series between said two coils, for detecting a current flowing through said coils;
    a first differential amplifier that amplifies the output signal of said magnetic detecting device and that supplies the current to induce said canceling magnetic field to said coils; and
    a second differential amplifier that amplifies the voltage across said shunt resistor and that outputs a measured voltage proportional to the current flowing through said conductor.

10. The current sensor according to claim 9, wherein said magnetic detecting device, said two coils and said shunt resistor are formed on a same substrate.

11. The circuit according to claim 9, wherein said two coils are respectively formed in a toroidal shape.

12. The circuit according to claim 9, wherein said magnetic detecting device comprises a magneto-resistance effect element, and said magneto-resistance effect element is a tunnel magneto-resistance effect element.

* * * * *